(12) United States Patent
Ohwada et al.

(10) Patent No.: US 11,495,776 B2
(45) Date of Patent: Nov. 8, 2022

(54) TRANSPARENT DESICCANT FOR ORGANIC EL, AND METHOD FOR USING SAME

(71) Applicant: SHIN-ETSU CHEMICAL CO., LTD., Tokyo (JP)

(72) Inventors: Hiroto Ohwada, Annaka (JP); Minoru Igarashi, Annaka (JP); Tsutomu Nakamura, Tokyo (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 148 days.

(21) Appl. No.: 17/043,874

(22) PCT Filed: Feb. 19, 2019

(86) PCT No.: PCT/JP2019/006062
§ 371 (c)(1),
(2) Date: Sep. 30, 2020

(87) PCT Pub. No.: WO2019/202837
PCT Pub. Date: Oct. 24, 2019

(65) Prior Publication Data
US 2021/0036261 A1 Feb. 4, 2021

(30) Foreign Application Priority Data
Apr. 16, 2018 (JP) .............................. JP2018-078146

(51) Int. Cl.
*H01L 51/52* (2006.01)
*B01J 20/26* (2006.01)
(Continued)

(52) U.S. Cl.
CPC .......... *H01L 51/5259* (2013.01); *B01J 20/26* (2013.01); *B01J 20/262* (2013.01);
(Continued)

(58) Field of Classification Search
CPC ................................................... H01L 51/5259
See application file for complete search history.

(56) References Cited

U.S. PATENT DOCUMENTS

| | | | |
|---|---|---|---|
| 2002/0015818 A1 | 2/2002 | Takahashi et al. | |
| 2007/0117920 A1* | 5/2007 | Hirabayashi | ............ C08L 83/04 524/588 |

(Continued)

FOREIGN PATENT DOCUMENTS

| | | |
|---|---|---|
| CN | 101107324 A | 1/2008 |
| CN | 106488949 A | 3/2017 |

(Continued)

OTHER PUBLICATIONS

Machine translation, Sakai, Japanese Pat. Pub. No. JP-2009-095824-A, translation date: Apr. 15, 2022, Espacenet, all pages. (Year: 2022).*

(Continued)

*Primary Examiner* — Victoria K. Hall
(74) *Attorney, Agent, or Firm* — Birch, Stewart, Kolasch & Birch, LLP

(57) ABSTRACT

A transparent desiccant for organic EL and methods for using the transparent desiccant are described, which is a cured product of an organopolysiloxane composition that contains (A) an alkenyl-group-containing organopolysiloxane including a linear organopolysiloxane having at least two alkenyl groups per molecule, (B) chemical formula (I):

$$H_a R_b SiO_{(4-a-b)/2} \qquad (I)$$

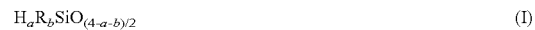

(where R is a C1-10 monovalent hydrocarbon group, a is 0.001-1.0, and b is 0.7-2.1), and (C) a hydrosilylation catalyst. The number of mol Y of silicon-atom-bonded hydrogen atoms (mol) in component (B) satisfies the formula 0.002 (mol)$\leq$(Y-X)$\leq$0.8 (mol) relative to the number of mol X of silicon-atom-bonded alkenyl groups (mol) in (Continued)

component (A). The transparent desiccant for an organic EL is highly transparent, capable of top emission, has low shrinkage growth, suppresses loss of an element light-emitting portion, suppresses the short-circuit phenomenon, and has exceptional defoaming properties in the material curing process.

5 Claims, 2 Drawing Sheets

(51) Int. Cl.
  *H01L 51/56* (2006.01)
  *B01J 20/28* (2006.01)
(52) U.S. Cl.
  CPC .... *B01J 20/28033* (2013.01); *H01L 51/5246* (2013.01); *H01L 51/56* (2013.01); *H01L 2251/558* (2013.01)

(56) References Cited

U.S. PATENT DOCUMENTS

| | | | |
|---|---|---|---|
| 2008/0051548 A1* | 2/2008 | Bailey | C08J 5/24 528/31 |
| 2008/0227938 A1* | 9/2008 | Kimura | C08L 83/04 556/51 |
| 2009/0085480 A1 | 4/2009 | Sakai et al. | |
| 2009/0236759 A1* | 9/2009 | Kashiwagi | H01L 23/296 525/478 |
| 2010/0015439 A1* | 1/2010 | Buether | C03C 17/30 428/428 |
| 2010/0224906 A1* | 9/2010 | Kashiwagi | H01L 33/56 257/E33.059 |
| 2011/0097579 A1* | 4/2011 | Mizuno | C08L 83/00 428/355 R |
| 2011/0098420 A1* | 4/2011 | Takizawa | C08L 83/06 528/10 |
| 2011/0203664 A1* | 8/2011 | Howell | B32B 17/10798 257/E31.117 |
| 2012/0245305 A1* | 9/2012 | Souda | C08G 77/34 525/479 |
| 2012/0269875 A1* | 10/2012 | Tamura | C08G 77/50 424/59 |
| 2012/0306363 A1 | 12/2012 | Mochizuki et al. | |
| 2012/0328539 A1* | 12/2012 | Tamura | C08G 77/14 424/59 |
| 2013/0004438 A1* | 1/2013 | Barba | A61K 8/891 424/59 |
| 2013/0012087 A1* | 1/2013 | Itoh | C09D 183/04 428/447 |
| 2014/0030202 A1* | 1/2014 | Simonnet | A61Q 19/00 424/69 |
| 2014/0044660 A1* | 2/2014 | Simonnet | A61K 8/022 424/63 |
| 2014/0161758 A1* | 6/2014 | Tamura | A61Q 19/00 424/78.02 |
| 2014/0187649 A1* | 7/2014 | Tamura | A61K 8/892 556/445 |
| 2014/0255329 A1* | 9/2014 | Simonnet | A61K 8/73 424/63 |
| 2015/0376344 A1 | 12/2015 | Dent et al. | |
| 2016/0108240 A1* | 4/2016 | Kashiwagi | C08L 83/04 525/478 |
| 2016/0233395 A1* | 8/2016 | Miyamoto | H01L 33/56 |
| 2017/0190879 A1 | 7/2017 | Iimura et al. | |
| 2018/0315906 A1 | 11/2018 | Sato et al. | |
| 2020/0270454 A1* | 8/2020 | Jia | C08K 5/56 |
| 2021/0079221 A1* | 3/2021 | Toya | C08G 77/14 |
| 2021/0277236 A1* | 9/2021 | Yabu | H01L 33/56 |

FOREIGN PATENT DOCUMENTS

| | | | | |
|---|---|---|---|---|
| EP | 1 079 666 A2 | | 2/2001 | |
| JP | 2001-57287 A | | 2/2001 | |
| JP | 2002-33187 A | | 1/2002 | |
| JP | 2009-095824 A | * | 5/2009 | ............ B01D 53/26 |
| JP | 2009-95824 A | | 5/2009 | |
| JP | 2011-016965 A | * | 1/2011 | .............. C08K 3/08 |
| JP | 2011-16965 A | | 1/2011 | |
| JP | 2014-168060 A | | 9/2014 | |
| JP | 2014-214249 A | * | 11/2014 | ... H01L 2224/48091 |
| JP | 2016-513165 A | | 5/2016 | |
| JP | 2017-88776 A | | 5/2017 | |
| WO | WO-2015118912 A1 | * | 8/2015 | ....... B29C 45/14311 |

OTHER PUBLICATIONS

Machine translation, Taiko, Japanese Pat. Pub. No. JP-2011-016965-A, translation date: Apr. 15, 2022, Espacenet, all pages. (Year: 2022).*

Machine translation, Kawamoto, Japanese Pat. Pub. No. JP-2014-214249-A, translation date: Apr. 15, 2022, Espacenet, all pages. (Year: 2022).*

Machine translation, Iida, WIPO Pat. Pub. No. WO-2015118912-A1, translation date: Apr. 22, 2022, Clarivate Analytics, all pages. (Year: 2022).*

International Search Report, issued in PCT/JP2019/006062, dated May 28, 2019.

Written Opinion of the International Searching Authority, issued in PCT/JP2019/006062, dated May 28, 2019.

* cited by examiner

TRANSPARENT DESICCANT FOR ORGANIC EL, AND METHOD FOR USING SAME

TECHNICAL FIELD

The present invention relates to a desiccant for an organic electroluminescent (EL) device, and a method of using the desiccant.

BACKGROUND ART

In organic electroluminescent (abbreviated below as "organic EL") panels, because the panel elements are "self-emissive," i.e., they emit light themselves, the panel does not require a separate light source such as the backlight in a liquid-crystal panel and thus has a low power consumption. Other characteristics of such panels include the ease of achieving a lower profile and a lighter weight. In addition, they reportedly have a higher picture quality than liquid-crystal panels. However, a drawback is that the elements are damaged by the ingress of even a trace amount of moisture into the panel (generating dark spots).

Because organic EL panels must be constructed so as to prevent moisture ingress to a high degree, a structure that hermetically seals the organic EL elements with, for example, a light-transmissive substrate made of glass or the like is generally used. This is a hollow, sealed structure in which a substrate of glass or the like has formed thereon an organic EL element constructed of an anode, an organic layer and a cathode arranged as successive layers and has joined thereto an opposing recessed glass member or the like, and is obtained by filling the interior with dried nitrogen gas or the like and bonding the end with a sealant. Various research aimed at carrying out the removal of moisture that has infiltrated into the organic EL panel during production has been reported, including methods which place a desiccant at the interior and methods which cover the organic EL element with a filler. Regardless of the method, cases in which the desiccant or filler has transparency are more effective because so-called top emission, in which light emitted by the organic EL device is extracted to the exterior from the top face, is possible.

Organic EL elements are formed for the most part by processes such as vapor deposition. However, an electrical short-circuit (shorting) between the cathode and the anode sometimes arises due to the presence of a small particle. When shorting arises, the elements around the particle causing the shorting must be separated with a laser or the like, which gives rise to problems such as partial loss of the emitted light and an increased number of fabrication steps.

Moreover, there is a pursuit of thinness in organic EL panels and, in addition to flat panels, other low-profile panels with a curved shape have attracted attention. Such low-profile panels require as well a tolerance to bending. Hence, not only thinness, but also flexibility is required.

Organic EL panels having a flexible structure that is foldable have also received a lot of attention. Thinness and flexibility are similarly required of the various constituent members, such as the light-transmitting substrate and also the desiccant, filler and the like.

Patent Document 1 discloses art which mixes a metal hydride as a desiccant into silicone rubber and places the mixture in an organic EL structure. The steps in this method are simple because filling the interior of the organic EL panel is not required. However, with a desiccant-containing silicone rubber, not only is it difficult to obtain light transmittance, when the silicone rubber is thinly formed, additional challenges include the presence of bubbles therein.

Patent Document discloses the use, as a transparent desiccant, of a mixture of a Group 2, Group 3 or Group 4 metal alkoxide with a transparent polymer that is inert to the metal alkoxide. In this method, there is a gradual loss of light transmittance as moisture absorption proceeds due to reaction of the metal alkoxide with moisture, and so maintaining the initial light transmittance is difficult. Also, in this method, a short circuit-suppressing effect is difficult to obtain.

PRIOR ART DOCUMENTS

Patent Documents

Patent Document 1: JP-A 2001-057287
Patent Document 2: JP-A 2009-095824

SUMMARY OF INVENTION

Technical Problem

The present invention was arrived at in light of the above circumstances. An object of the invention is to provide a transparent desiccant for an organic EL device which is highly transparent, making top emission possible, has a small growth in pixel shrinkage even at high temperature and high humidity, has the effects of suppressing the loss of element light-emitting regions (dark spot formation) and of suppressing electrical shorting, and has an excellent degassing ability in the material curing process. Another object is to provide a method of using such a desiccant.

Solution to Problem

The inventors have conducted extensive investigations aimed at achieving the above objects. As a result, they have found that by using the cured form of an organopolysiloxane composition having a specific make-up as a transparent desiccant for an organic EL device, the composition has an excellent degassing ability during curing, has a high transparency that makes top emission possible, suppresses the growth in pixel shrinkage under high temperature and high moisture, and is able to suppress dark spot formation and electrical shorting. This discovery ultimately led to the present invention.

Accordingly, the present invention provides the following transparent desiccant for an organic EL device and method for the use thereof.

1. A transparent desiccant for an organic EL device, the desiccant being a cured organopolysiloxane composition that contains:
   (A) an alkenyl group-containing organopolysiloxane which includes a linear organopolysiloxane having at least two alkenyl groups per molecule,
   (B) an organohydrogenpolysiloxane of formula (I) below $$H_a R_b SiO_{(4-a-b)/2} \qquad (I)$$

(wherein R is a monovalent hydrocarbon group of 1 to 10 carbon atoms, the subscript "a" is from 0.001 to 1.0 and the subscript "b" is from 0.7 to 2.1), and
   (C) a hydrosilylation catalyst,
wherein the number of moles of silicon-bonded hydrogen atoms Y in component (B) and the number of moles of silicon-bonded alkenyl groups X in component (A) satisfy formula (2) below:

$$0.002 \text{ moles} \leq (Y-X) \leq 0.8 \text{ mole} \tag{2}$$

2. A method of using a transparent desiccant for an organic EL device which includes the step of disposing and using the transparent desiccant for an organic EL device of 1 above in an organic EL panel.

3. The method of using a transparent desiccant for an organic EL device of 2 above, wherein the transparent desiccant is in the form of a sheet having a thickness of from 1.0 μm to 2 mm.

4. The method of using a transparent desiccant for an organic EL device of 2 or 3 above, wherein the desiccant is placed solely above an organic EL element.

Advantageous Effects of Invention

The transparent desiccant for an organic EL device of the invention is highly transparent, has a small growth in pixel shrinkage under high temperature and high humidity, and can suppress organic EL element degradation (dark spot formation). Moreover, because the transparent desiccant of the invention is highly transparent, it is suitable for top-emitting EL devices which transmit the light emitted by an organic EL element through the top side of the device.

Also, the inventive method of using the transparent desiccant for an organic EL device disposes the desiccant within an organic EL panel. In cases where it is necessary to thinly form the desiccant, it is possible to form the organopolysiloxane composition into a thin film having an excellent degassing ability in a curing step following application of the composition.

In addition, with regard to the transparent desiccant and method of use of the invention, the transparent desiccant need not be in contact with the organic EL element. The low-molecular-weight siloxane within the desiccant diffuses and accumulates within the organic EL panel, insulating the vicinity of small particles that have become present during formation of the organic EL element and making it possible to achieve the effect of suppressing electrical shorting between the cathode and the anode by the particles.

DESCRIPTION OF EMBODIMENTS

Figure 1A:
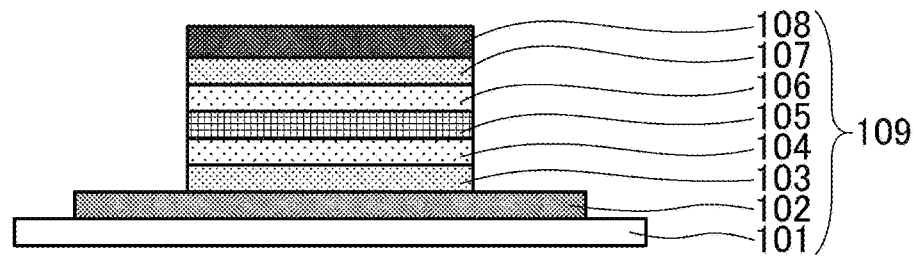
FIG. 1 is a schematic diagram illustrating a method of attaching a transparent desiccant for an organic EL device according to one embodiment of the invention within an organic EL panel.
Figure 1B:
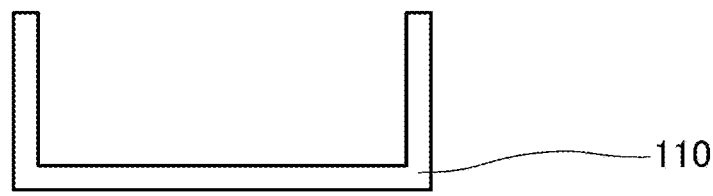
Figure 1C:
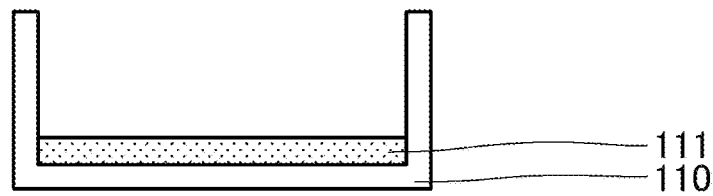
Figure 1D:
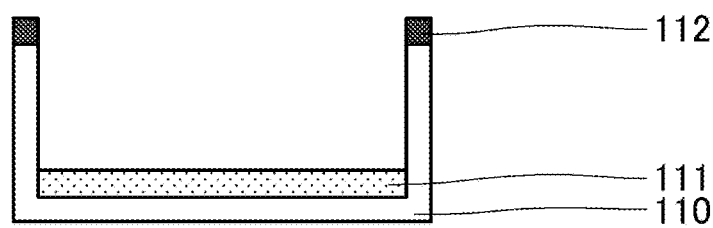
Figure 1E:
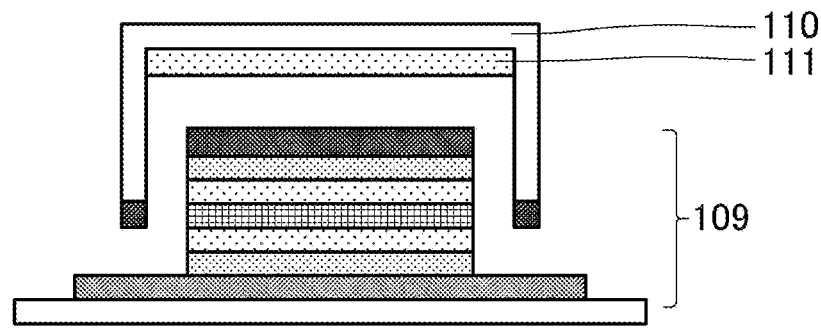

The invention is described more fully below.

The transparent desiccant for an organic EL device of the invention is the cured form of an organopolysiloxane composition that contains components (A) to (C) below:

(A) an alkenyl group-containing organopolysiloxane which includes a linear organopolysiloxane having at least two alkenyl groups per molecule, (B) an organohydrogenpolysiloxane of formula (I) below

(wherein R is a monovalent hydrocarbon group of 1 to 10 carbon atoms, the subscript "a" is from 0.001 to 1.0 and the subscript "b" is from 0.7 to 2.1), and (C) a hydrosilylation catalyst.

(A) Alkenyl Group-Containing Organopolysiloxane

The alkenyl group-containing organopolysiloxane serving as component (A) in the invention is the base polymer of the organopolysiloxane composition. Component (A) includes a linear organopolysiloxane having at least two alkenyl groups per molecule.

The linear organopolysiloxane in component (A) is a linear organopolysiloxane having at least 2, and preferably from 2 to 8, alkenyl groups per molecule. Specifically, it is an organopolysiloxane of formula (1) below.

In formula (1), each $R^1$ is independently a monovalent hydrocarbon group selected from alkyl groups of 1 to 10 carbon atoms, aryl groups of 6 to 12 carbon atoms and alkenyl groups of 2 to 10 carbon atoms. Specific examples of the monovalent hydrocarbon group include alkyl groups such as methyl, ethyl, propyl, butyl, pentyl, hexyl and cyclohexyl groups; alkenyl groups such as vinyl, allyl, butenyl, pentenyl, hexenyl and cyclohexenyl groups; and aryl groups such as the phenyl group. It is preferable for the compound to have, as the $R^1$ groups, alkenyl groups only at the ends. The subscript "x" is an integer from 100 to 50,000, and preferably an integer from 150 to 20,000.

The linear organopolysiloxane is exemplified by dimethylsiloxane/methylvinylsiloxane copolymers capped at both ends of the molecular chain with trimethylsiloxy groups, methylvinylpolysiloxanes capped at both ends of the molecular chain with trimethylsiloxy groups, dimethylsiloxane/methylvinylsiloxane/methylphenylsiloxane copolymers capped at both ends of the molecular chain with trimethylsiloxy groups, dimethylpolysiloxanes capped at both ends of the molecular chain with dimethylvinylsiloxy groups, methylvinylpolysiloxanes capped at both ends of the molecular chain with dimethylvinylsiloxy groups, dimethylsiloxane/methylvinylsiloxane copolymers capped at both ends of the molecular chain with dimethylvinylsiloxy groups, dimethylsiloxane/methylvinylsiloxane/methylphenylsiloxane copolymers capped at both ends of the molecular chain with dimethylvinylsiloxy groups, dimethylpolysiloxanes capped at both ends of the molecular chain with divinylmethylsiloxy groups, dimethylsiloxane/methylvinylsiloxane copolymers capped at both ends of the molecular chain with divinylmethylsiloxy groups, dimethylpolysiloxanes capped at both ends of the molecular chain with trivinylsiloxy groups, dimethylsiloxane/methylvinylsiloxane copolymers capped at both ends of the molecular chain with trivinylsiloxy groups and mixtures of two or more of these organopolysiloxanes.

The linear organopolysiloxane may be of one type or two or more types may be used together. When two or more types of the above linear organopolysiloxane are used together, the weight-average molecular weight of the low-molecular-weight-side organopolysiloxane is preferably from 1,000 to 50,000, and more preferably from 1,500 to 20,000. The weight-average molecular weight of the high-molecular-weight-side organopolysiloxane is preferably more than 1,500 and up to 200,000, and more preferably more than 2,000 and up to 100,000. These are set such that (weight-average molecular weight of low-molecular-weight-side organopolysiloxane)<(weight-average molecular weight of high-molecular-weight-side organopolysiloxane).

The weight-average molecular weights in this invention can be determined as polystyrene-equivalent weight-average molecular weights by gel permeation chromatographic (GPC) analysis, with measurements being carried out under the conditions shown below and using tetrahydrofuran as the developing solvent.

[Measurement Conditions]
Developing solvent: Tetrahydrofuran (THF)
Flow rate: 0.6 mL/min
Detector: Differential refractive index detector (RI)
Columns: TSK Guardcolumn SuperH-L
    TSKgel SuperH4000 (6.0 mm I.D.×15 cm×1)
    TSKgel SuperH3000 (6.0 mm I.D.×15 cm×1)
    TSKgel SuperH2000 (6.0 mm I.D.×15 cm×2)
    (all from Tosoh Corporation)
Column temperature: 40° C.
Sample preparation conditions:
    1 part by weight of a 50% xylene solution of the organopolysiloxane resin is dissolved in 1,000 parts by weight of THF, and the solution is filtered with a membrane filter
Amount of sample injected: 10 μL As mentioned above, the alkenyl group-containing organopolysiloxane serving as component (A) includes the foregoing linear organopolysiloxane, but may also contain other organopolysiloxanes, such as alkenyl group-containing resinous organopolysiloxanes. However, when the alkenyl group-containing resinous organopolysiloxane is included in more than a given amount, bubbles arise upon curing the organopolysiloxane composition under applied heat, which may worsen the light transmissivity of the cured composition. Hence, setting the content thereof within component (A) to less than 1 wt % is preferred.

(B) Organohydrogenpolysiloxane

The organohydrogenpolysiloxane serving as component (B) in the invention plays the role of a crosslinking agent which forms a crosslinked structure by hydrosilylation with the above alkenyl group-containing organopolysiloxane.

This is an organohydrogenpolysiloxane of the following average formula (I)

$$H_aR_bSiO_{(4-a-b)/2} \quad (1)$$

which has at least two silicon-bonded hydrogen atoms per molecule.

In the above formula, R is a monovalent hydrocarbon group of 1 to 10 carbon atoms, preferably 1 to 8 carbon atoms; the subscript "a" is a number from 0.001 to 1.0, preferably from 0.01 to 1.0; the subscript "b" is a number from 0.7 to 2.1, preferably from 0.8 to 2.0; and the sum a+b is from 0.801 to 3.0, preferably from 1.0 to 2.5.

Specific examples of R in the above formula include alkyl groups such as methyl, ethyl, propyl, butyl, pentyl, hexyl and cyclohexyl groups; and aryl groups such as the phenyl group. Of these, methyl, ethyl and phenyl groups are preferred. Methyl and ethyl groups are especially preferred.

Specific examples of this organohydrogenpolysiloxane that serves as component (B) include 1,1,3,3-tetramethyldisiloxane, 1,3,5,7-tetramethylcyclotetrasiloxane, tris(hydrogendimethylsiloxy)methylsilane, tris(hydrogendimethylsiloxy)phenylsilane, methylhydrogencyclopolysiloxane, methylhydrogensiloxane/dimethylsiloxane cyclic copolymers, methylhydrogenpolysiloxanes capped at both ends of the molecular chain with trimethylsiloxy groups, dimethylsiloxane/methylhydrogensiloxane copolymers capped at both ends of the molecular chain with trimethylsiloxy groups, dimethylsiloxane/methylhydrogensiloxane/methylphenylsiloxane copolymers capped at both ends of the molecular chain with trimethylsiloxy groups, dimethylsiloxane/methylhydrogensiloxane/diphenylsiloxane copolymers capped at both ends of the molecular chain with trimethylsiloxy groups, methylhydrogenpolysiloxanes capped at both ends of the molecular chain with dimethylhydrogensiloxy groups, dimethylpolysiloxanes capped at both ends of the molecular chain with dimethylhydrogensiloxy groups, dimethylsiloxane/methylhydrogensiloxane copolymers capped at both ends of the molecular chain with dimethylhydrogensiloxy groups, dimethylsiloxane/methylphenylsiloxane copolymers capped at both ends of the molecular chain with dimethylhydrogensiloxy groups, dimethylsiloxane/diphenylsiloxane copolymers capped at both ends of the molecular chain with dimethylhydrogensiloxy groups, methylphenylpolysiloxanes capped at both ends of the molecular chain with dimethylhydrogensiloxy groups, diphenylpolysiloxanes capped at both ends of the molecular chain with dimethylhydrogensiloxy groups, any of these compounds in which some or all of the methyl groups are substituted with other alkyl groups such as ethyl or propyl groups, organosiloxane copolymers consisting of siloxane units of the formula $R^3SiO_{1/2}$, siloxane units of the formula $R^2HSiO_{1/2}$ and siloxane units of the formula $SiO_{4/2}$, organosiloxane copolymers consisting of siloxane units of the formula $R^2HSiO_{1/2}$ and siloxane units of the formula $SiO_{4/2}$, organosiloxane copolymers consisting of siloxane units of the formula $RHSiO_{2/2}$, siloxane units of the formula $RSiO_{3/2}$ and siloxane units of the formula $HSiO_{3/2}$, and mixtures of two or more of these organopolysiloxanes.

The component (B) content is adjusted so as to satisfy the condition in formula (2) below $$0.002 \text{ mole} \leq (Y-X) \leq 0.8 \text{ mole} \quad (2),$$

where Y is the number of moles of silicon-bonded hydrogen atoms in component (B) and X is the number of moles of silicon-bonded alkenyl groups in component (A). The content of component (B) is preferably adjusted so as to satisfy formula (2') below, and more preferably adjusted so as to satisfy formula (2") below.

$$0.006 \text{ mole} \leq (Y-X) \leq 0.8 \text{ mole} \quad (2'),$$

$$0.010 \text{ mole} \leq (Y-X) \leq 0.8 \text{ mole} \quad (2''),$$

If the above numerical range is not satisfied, dark spots may form in the organic EL device, resulting in a loss of EL durability.

The Y/X value is not particularly limited, and is preferably at least 2/1, and more preferably at least 3/1.

(C) Hydrosilylation Catalyst

The hydrosilylation catalyst serving as component (C) in this invention has a catalytic action when the alkenyl group-containing organopolysiloxane serving as component (A) and the organohydrogenpolysiloxane serving as component (B) are crosslinked via a hydrosilylation reaction. It is an ingredient that is essential for the crosslinking reaction to rapidly proceed.

The hydrosilylation catalyst is preferably a platinum group metal-based catalyst. Specific examples of platinum group metal-based catalysts include platinum black, platinic chloride, chloroplatinic acid, the reaction products of chloroplatinic acid with a primary alcohol, complexes of chloroplatinic acid and olefins, complexes of chloroplatinic acid and vinyl group-containing (poly)siloxanes, platinum-acetylacetone complexes and platinum-cyclopentadienyl complexes.

The content of component (C), expressed in terms of the elemental metal (weight basis) with respect to the amount of component (A), is generally from 0.5 to 1,000 ppm, and preferably from 1 to 500 ppm. When the content is lower than this numerical range, the curability of the composition declines. On the other hand, a content higher than this range results in a high cost and is uneconomical.

Other Ingredients

The above organopolysiloxane composition, which is the material making up the transparent desiccant for organic EL devices of the invention, may additionally include ingredients other than above components (A) to (C) within ranges that do not detract from the working effects of the invention. Examples of such other ingredients include reaction regulators for the hydrosilylation reaction, tackifiers (especially organosilicon compounds such as functional alkoxysilanes which contain on the molecule at least one type of functional group selected from alkenyl, epoxy, amino, (meth)acryloxy and mercapto groups and do not contain SiH groups on the molecule), and thixotropic agents.

The organopolysiloxane composition can be prepared by uniformly mixing the above ingredients using a commonly used mixer/stirrer or kneader, such as a kneader or a planetary mixer.

Method of Producing Transparent Desiccant for Organic EL Device

The transparent desiccant for an organic EL device of the invention is a cured form of the above-described organopolysiloxane composition. A known forming method may be suitably selected as the method of forming this organopolysiloxane composition, in accordance with the shape and size of the target formed article. Exemplary forming methods include casting, compression molding, injection molding, calendering, extrusion, coating and screen printing. The curing conditions may be conditions that are known to the forming method that is employed, and typically include a forming time of from several seconds to about one day at a temperature of between 60 and 450° C., preferably between 80 and 400° C., and more preferably between 120 and 200° C. Post-curing (secondary vulcanization) in, for example, an oven at between 150 and 250° C., preferably between 200 and 240° C., for one hour or more, preferably from about 1 hour to about 70 hours, and more preferably from about 1 hour to about 10 hours, may be carried out for the purpose of, for example, reducing the amount of low-molecular-weight siloxane ingredients remaining in the cured product.

The organopolysiloxane composition can used after being rendered into a sheet by a method of application such as dispensing or injection, or by a conventional method such as screen printing, calendering, injection or pressing. In this case, the silicone rubber sheet obtained by rendering the organopolysiloxane composition into a sheet is preferably formed to a thickness of from 1.0 µm to 2 mm, and more preferably from 1.0 µm to 1 mm. A thickness of less than 1.0 µm is undesirable because the desired effects of the invention cannot all be obtained. On the other hand, a thickness greater than 2 mm is unsuitable because this increase the total thickness of the organic EL device.

The transparent desiccant obtained in this way is highly transparent and can easily be rendered into a thin film, making it suitable as a transparent desiccant for an organic EL device. Specifically, it is suitable to use a transparent desiccant which, in a sheet of the cured composition having a thickness of 1 mm, has a total light transmittance, as measured by a method in accordance with JIS K 7361-1: 1997, of 90% or more. At a total light transmittance of the cured sheet below 90%, this transparent desiccant may be disadvantageous for use in an organic EL module.

Method of Using Transparent Desiccant for Organic EL Device

As already mentioned, it is suitable to use the above organopolysiloxane composition as a silicone rubber sheet having a thickness after curing of from 1.0 µm to 2 mm. The organopolysiloxane composition is especially well-suited for use in an organic EL panel. The organic EL panel in which the transparent desiccant of the invention is used has a hollow, sealed structure in which a substrate made of glass or the like has formed thereon an organic EL element constructed of an anode, an organic layer and a cathode arranged as successive layers and has joined thereto an opposing recessed glass member or the like. To illustrate an example of the use of the transparent desiccant of the invention, in an organic EL panel which is fabricated by dripping a given amount of the organopolysiloxane composition, or application of the composition such as by dispensing or injection, onto the recessed interior of the recessed glass member and then curing the composition, the transparent desiccant of the invention can be placed solely above the organic EL element. Moreover, the desiccant is in a state where it is not in contact with the organic EL element. That is, because this method of using the transparent desiccant for an organic EL device is not a method that tightly fills the interior of the organic EL panel, the preformed transparent desiccant is employed without coming into contact with the organic EL element, making the production steps easy. When fabricating a flat panel, depending on the circumstances, the transparent desiccant may be coated directly onto the organic EL element or it may be used between, for example, SiO and SiN films having barrier properties. Also, in the above method of using the transparent desiccant, although the transparent desiccant is not in contact with the organic EL device, the small-molecular-weight siloxane in the desiccant diffuses and accumulates within the organic EL panel, insulating the vicinity of small particles present when the organic EL element is formed. Hence, with this method, the advantageous effect of suppressing electrical shorting, i.e., short-circuiting of the cathode and anode by particles, can be obtained.

EXAMPLES

Examples and Comparative Examples are given below to fully illustrate the invention, although the invention is not limited by these Examples. In the units used to express the amounts in which the ingredients are included, "parts" represents parts by weight. Also, "Me" stands for a methyl group and "Vi" stands for a vinyl group.

Preparation Example 1

[Preparation of Organopolysiloxane Composition 1]

Thirty parts of a dimethylpolysiloxane capped at both ends with $Me_2ViSiO_{1/2}$ units (weight-average molecular weight, 1,000) and 70 parts of a dimethylpolysiloxane capped at both ends with $Me_2ViSiO_{1/2}$ units (weight-average molecular weight, 5,000) were used as Component (A), and organohydrogenpolysiloxanes of the following average formula

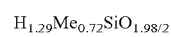

$H_{1.29}Me_{0.72}SiO_{1.98/2}$ wherein the number of moles of silicon-bonded hydrogen atoms per unit weight Y (mol/g) relative to the number of moles of silicon-bonded vinyl groups per unit weight X (mol/g) in component (A) satisfies formulas (1) to (3) below $$Y-X=0.06 \text{ mol/g} \quad (1)$$

$$Y-X=0.6 \text{ mol/g} \quad (2)$$

$$Y-X=1.3 \text{ mol/g} \quad (3)$$

were each prepared as component (B).

In addition, 0.1 part of a 1,1-divinyltetramethyldisiloxane complex solution of chloroplatinic acid (1 wt %, based on elemental platinum) was used as component (C) and 0.03 part of 1-ethynyl-1-cyclohexanol was used as the hydrosilylation reaction regulator, and these ingredients were kneaded for 10 minutes in a planetary mixer (PLMG-350, from Inoue Mfg., Inc.), thereby giving Organopolysiloxane Composition 1.

Preparation Example 2

[Preparation of Organopolysiloxane Composition 2]

In the organopolysiloxane serving as component (A), components (A-1) and (A-2) below:
(A-1) a resinous organopolysiloxane having at least two alkenyl groups per molecule, and
(A-2) a linear organopolysiloxane having at least two alkenyl groups per molecule were each prepared such that the sum of (A-1) and (A-2) was 100 wt % and to the following ratios (i) and (ii).
 (i) (A-1):(A-2)=1:99
 (ii) (A-1):(A-2)=50:50

Specifically, 49.0 parts of a resinous organopolysiloxane consisting of 6.8 mol % of $Me_2ViSiO_{1/2}$ units, 39.8 mol % of $Me_3SiO_{1/2}$ units and 53.4 mol % of $SiO_{4/2}$ units (weight-average molecular weight=6,000: Composition a) and 1.0 part of a resinous organopolysiloxane consisting of 50 mol % of $Me_2ViSiO_{1/2}$ units and 50 mol % of $MeSiO_{3/2}$ units (weight-average molecular weight=5.000: Composition b) were used as component (A-1), and 15 parts of a dimethylpolysiloxane capped at both ends with $Me_2ViSiO_{1/2}$ units (weight-average molecular weight=1,000: Composition c) and 35 parts of a dimethylpolysiloxane capped at both ends with $Me_2ViSiO_{1/2}$ units (weight-average molecular weight=5,000: Composition d) were used as component (A-2).

An organohydrogenpolysiloxane of the following average formula

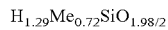

in which the number of moles of silicon-bonded hydrogen atoms per unit weight Y (mol/g) relative to the number of moles of silicon-bonded vinyl groups per unit weight X (mol/g) in component (A) satisfies the following formula $$Y-X=0.6 \text{ mol/g}$$

was prepared as component (B).

In addition, as in Preparation Example 1, 0.1 part of a 1,1-divinyltetramethyldisiloxane complex solution of chloroplatinic acid (1 wt %, based on elemental platinum) was used as component (C) and 0.03 part of 1-ethynyl-1-cyclohexanol was used as the hydrosilylation reaction regulator, and these ingredients were kneaded for 10 minutes in a planetary mixer (PLMG-350, from Inoue Mfg., Inc.), thereby giving Organopolysiloxane Composition 2.

[Process for Fabricating Organic EL Panel]

An organic EL panel fabrication process in which the transparent desiccant of the invention is attached within an organic EL panel is described while referring to FIGS. 1 (A) to 1 (E). This fabrication process involves the formation of an organic EL element layered glass body (109) by forming the following as successive layers on a non-alkali glass substrate (101) having a thickness of 1 mm and a size of 50 mm×50 mm: an anode (102), a hole injection layer (103), a hole transport layer (104), a light-emitting layer (105), an electron transport layer (106), an electron injection layer (107) and a cathode (108) (see FIG. 1 (A)).

Next, within a box having a $N_2$ atmosphere regulated to a moisture level of 10 ppm or less, the above organopolysiloxane composition (111) was dripped onto a 38 mm×38 mm portion of the recessed interior of a separately provided non-alkali sealing glass member (110) having a thickness of 1 mm, a size of 42 mm×42 mm and a recessed shape (FIG. 1 (B)). This was left to stand on a flat plate for about 30 minutes, allowing the deposited organopolysiloxane composition to fully flatten over the 38 mm×38 mm surface area, following which it was placed on a 110° C. heater plate and heated for 30 minutes, thereby curing the organopolysiloxane composition (the state shown in FIG. 1 (C)).

As shown in FIG. 1 (D), within the same box, a UV-curable epoxy resin (112) was then dispensed onto a 2 mm wide portion at the end of the non-alkali sealing glass member (110), following which the organic EL element layered glass body (109) was attached thereto in a direction that places the organic layers at the interior of the glass member. Next, using a metal-halide lamp (HANDY UV-100, from ORC), UV irradiation was carried out at an ultraviolet light intensity of 10 mW/cm$^2$ to a cumulative exposure dose of 10,000 mJ/cm$^2$, causing the epoxy resin to adhere and thereby giving the organic EL panel (113) shown in FIG. 2.

Example 1

The organopolysiloxane composition was prepared as described in Preparation Example 1, with preparation being carried out such that the number of moles of silicon-bonded hydrogen atoms per unit weight Y (mol/g) in the organohydrogenpolysiloxane relative to the number of moles of silicon-bonded vinyl groups per unit weight X (mol/g) in component (A) satisfies the following formula $$Y-X=0.06 \text{ mol/g}.$$

Figure 2:
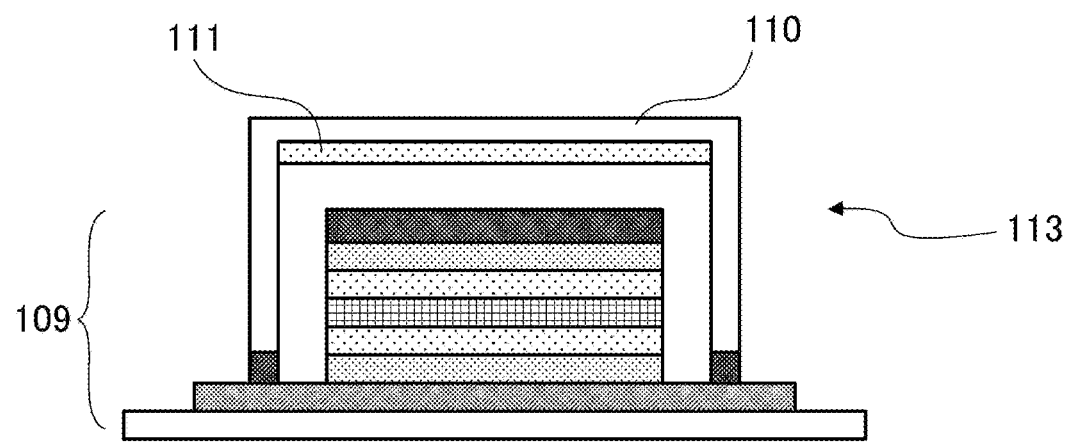
FIG. 2 is a schematic diagram showing the organic EL panel obtained by the method shown in FIG. 1.

The resulting organopolysiloxane composition was disposed within the organic EL panel by the procedure described in the above organic EL panel fabrication process, thereby giving the organic EL panel (113) shown in FIG. 2 having a transparent desiccant attached therein. The amount of organopolysiloxane composition added by dripping within the organic EL panel was set to 0.043 g (an amount corresponding to a thickness of 30 μm).

Examples 2 to 4

Following the same procedure as in Example 1, the amount of organopolysiloxane composition added by dripping within the organic EL panel was set to 0.43 g (an amount corresponding to a thickness of 300 μm) [Example 2], 1.44 g (1,000 μm) [Example 3] or 2.88 g (2,000 μm) [Example 4].

Comparative Example 1

The same procedure was followed as in Example 1, but the amount of organopolysiloxane composition added by dripping within the organic EL panel was set to 0.014 g (1

μm) [Comparative Example 1]. These results are collectively shown in Table 1.
[Durability]
The organic EL panels thus obtained were EL driven at a current density of 10 mA/cm² in a normal room-temperature (25° C.) atmosphere and examined for dark spots using an optical microscope (LV150N, from Nikon Corporation). These were recorded as the initial results.

The organic EL panels were then placed in a high-temperature high-humidity test chamber regulated to 60° C. and 90% RH. Every 200 hours, they were taken out into a normal room-temperature (25° C.) atmosphere, similarly EL driven at a current density of 10 mA/cm², and changes in the size and number of dark spots were checked with the optical microscope. Exposure in the high-temperature high-humidity test chamber was carried out for 1,000 hours.

The durability was rated as follows based on dark spots having a diameter of 5 μm or more: cases in which such dark spots accounted for less than 3% of the total emissive surface area were rated as "A: excellent", cases in which they accounted for at least 3% but less than 5% were rated as "B: good", and cases in which they accounted for 5% or more were rated as "C: poor".
[Foaming Residue]
Each of the organopolysiloxane compositions was checked for the presence or absence of foaming from the interior of the organopolysiloxane composition and spontaneous defoaming when the composition was cured by heating at the recessed interior of the non-alkali sealing glass member (110). The method of verification consisted of carrying out a visual examination. When there were bubbles that did not spontaneously break up and remained behind, this was indicated as "Bubbles present: X"; when spontaneous defoaming occurred, this was indicated as "No bubbles: ○." From the standpoint of ability to transmit the emitted light, an absence of bubbles remaining in the organopolysiloxane composition is desirable.
[Presence/Absence of Shorting Defects]
Five samples of each of the above organic EL panels were fabricated, subjected in the same way as described above to a 1,000-hour exposure test in a high-temperature high-humidity chamber regulated to 60° C. and 90% RH and then taken out into a room-temperature (25° C.) atmosphere, following which the organic EL panels were examined for the presence or absence of electrical shorting. The presence/absence of shorting was determined by checking for the presence or absence of luminescence when a current of at least 10 mA/cm² was applied. In cases where luminescence was not observed, the cathode was checked for the presence or absence of a shorting mark thereon. When there was a shorting mark, if luminescence was restored by separating particles near the shorting mark by laser, that sample was identified as a shorting defective sample. The table indicates the number of samples, out of all five samples, in which shorting defects occurred; that is, [number of samples in which shorting defects occurred/total number of samples (5)].

TABLE 1

|  |  | Example | | | | Comparative Example |
|---|---|---|---|---|---|---|
|  |  | 1 | 2 | 3 | 4 | 1 |
| Y-X amount per unit weight | Y-X (mol/g) | 0.06 | 0.06 | 0.06 | 0.06 | 0.06 |
| Amount used | Film thickness (μm) | 30 | 300 | 1000 | 2000 | 1 |
|  | Weight (g) | 0.043 | 0.432 | 1.44 | 2.88 | 0.0014 |
| Y-X amount | Y-X (mol) | 0.0026 | 0.026 | 0.086 | 0.173 | 0.00008 |
| Durability (60° C., 90% RH) | Initial | A | A | A | A | A |
|  | 200 hours | A | A | A | A | B |
|  | 400 hours | A | A | A | A | B |
|  | 600 hours | B | A | A | A | C |
|  | 800 hours | B | A | A | A | C |
|  | 1,000 hours | B | A | A | A | C |
| Foaming residue | Visual inspection (Bubbles present: X, No bubbles: ○) | ○ | ○ | ○ | ○ | ○ |
| Occurrence of shorting defects |  | 0/5 | 0/5 | 0/5 | 0/5 | 0/5 |

As shown in Table 1, at Y-X=0.06 mol/g, when the amount of organopolysiloxane used was 0.043 g (30 μm), Y-X=0.0026 mol (Example 1); when the amount used was 0.43 g (300 μm), Y-X=0.026 mol (Example 2); when the amount used was 1.44 g (1,000 μm), Y-X=0.086 mol (Example 3); when the amount used was 2.88 g (2,000 μm), Y-X=0.17 mol (Example 4). In the organic EL panel EL durability tests in a 60° C., 90% RH environment, at the Y-X amount of 0.0026 mol shown in Example 1, results indicative of a good durability were obtained. A good durability was confirmed in each of Examples 2, 3 and 4 in which large amounts of organopolysiloxane were used. On the other hand, at the X-Y amount of 0.00008 mol (i.e., Y-X=0.06 mol/g) shown in Comparative Example 1, the amount of organopolysiloxane used was 0.0014 g (1 μm) and so the durability was inadequate. With regard to foaming residue and the occurrence of shorting defects, the results were good under all of the conditions shown in Table 1. That is, the results in Table 1 demonstrate that suitable results are obtained at Y-X=0.0026 mol or more.

Example 5

The organopolysiloxane composition was prepared as described in Preparation Example 1, with preparation being carried out such that the number of moles of silicon-bonded hydrogen atoms per unit weight Y (mol/g) in the organohydrogenpolysiloxane relative to the number of moles of silicon-bonded alkenyl groups per unit weight X (mol/g) in component (A) satisfies the following formula $$Y-X=0.6 \text{ mol/g}.$$

The resulting organopolysiloxane composition was disposed within the organic EL panel by the procedure described in the above organic EL panel fabrication process. The amount of organopolysiloxane composition added by dripping within the organic EL panel was set to 0.0043 g (an amount corresponding to a thickness of 3 μm).

Examples 6 and 7, Comparative Example 2

Following the same procedure as in Example 5, the amount of organopolysiloxane composition added by dripping within the organic EL panel was set to 0.14 g (an amount corresponding to a thickness of 100 μm) [Example 6] or 0.86 g (600 μm) [Example 7].

In Comparative Example 2, the same procedure was followed as in Example 1, but the amount of organopolysiloxane composition added by dripping within the organic EL panel was set to 0.0014 g (1 μm).

These results are collectively shown in Table 2.

shown in Table 2. That is, the results in Table 2 demonstrate that suitable results are obtained at Y−X=0.0026 mol or more.

Example 8

The organopolysiloxane composition was prepared as described in Preparation Example 1, with preparation being carried out such that the number of moles of silicon-bonded hydrogen atoms per unit weight Y (mol/g) in the organohydrogenpolysiloxane relative to the number of moles of silicon-bonded alkenyl groups per unit weight X (mol/g) in component (A) satisfies the following formula $Y-X=1.3$ mol/g.

The resulting organopolysiloxane composition was disposed within the organic EL panel by the procedure described in the above organic EL panel fabrication process. The amount of organopolysiloxane composition added by

TABLE 2

|  |  | Example | | | Comparative Example |
| --- | --- | --- | --- | --- | --- |
|  |  | 5 | 6 | 7 | 2 |
| Y-X amount per unit weight | Y-X (mol/g) | 0.6 | 0.6 | 0.6 | 0.6 |
| Amount used | Film thickness (μm) | 3 | 100 | 600 | 1 |
|  | Weight (g) | 0.00432 | 0.144 | 0.86 | 0.0014 |
| Y-X amount | Y-X (mol) | 0.0026 | 0.086 | 0.52 | 0.0008 |
| Durability | Initial | A | A | A | A |
| (60° C., | 200 hours | A | A | A | B |
| 90% RH) | 400 hours | A | A | A | B |
|  | 600 hours | B | A | A | C |
|  | 800 hours | B | A | A | C |
|  | 1,000 hours | B | A | A | C |
| Foaming residue | Visual inspection (Bubbles present: X, No bubbles: ○) | ○ | ○ | ○ | ○ |
| Occurrence of shorting defects |  | 0/5 | 0/5 | 0/5 | 0/5 |

As shown in Table 2, at Y−X=0.6 mol/g, when the amount of organopolysiloxane used was 0.0043 g (3 in), Y−X=0.0026 mol (Example 5); when the amount used was 0.144 g (100 μm), Y−X=0.086 mol (Example 6); when the amount used was 0.86 g (600 in), Y−X=0.52 mol (Example 7). In the organic EL panel EL durability tests in a 60° C., 90% RH environment, at the Y−X amount of 0.0026 mol shown in Example 5, results indicative of a good durability were obtained. A good durability was confirmed in each of Examples 6 and 7 in which large amounts of organopolysiloxane were used. On the other hand, at the Y−X amount of 0.0008 mol (i.e., Y−X=0.6 mol/g) shown in Comparative Example 2, the amount of organopolysiloxane used was 0.0014 g (1 μm) and so the durability was inadequate. With regard to foaming residue and the occurrence of shorting defects, the results were good under all of the conditions dripping within the organic EL panel was set to 0.0014 g (an amount corresponding to a thickness of 1 μm).

Examples 9 and 10, Comparative Example 3

Following the same procedure as in Example 8, the amount of organopolysiloxane composition added by dripping within the organic EL panel was set to 0.0029 g (an amount corresponding to a thickness of 2 μm) [Example 9] or 0.014 g (10 μm) [Example 10].

In Comparative Example 3, the same procedure was followed as in Example 1, but the amount of organopolysiloxane composition added by dripping within the organic EL panel was set to 0.0007 g (0.5 μm).

These results are collectively shown in Table 3.

TABLE 3

|  |  | Example | | | Comparative Example |
| --- | --- | --- | --- | --- | --- |
|  |  | 8 | 9 | 10 | 3 |
| Y-X amount per unit weight (/g) | Y-X (mol/g) | 1.3 | 1.3 | 1.3 | 1.3 |
| Amount used | Film thickness (μm) | 1 | 2 | 10 | 0.5 |
|  | Weight (g) | 0.0014 | 0.0029 | 0.014 | 0.0007 |

TABLE 3-continued

|  |  | Example | | | Comparative Example |
|---|---|---|---|---|---|
|  |  | 8 | 9 | 10 | 3 |
| Y–X amount | Y–X (mol) | 0.002 | 0.004 | 0.018 | 0.001 |
| Durability | Initial | A | A | A | A |
| (60° C., | 200 hours | A | A | A | B |
| 90% RH) | 400 hours | A | A | A | B |
|  | 600 hours | B | A | A | C |
|  | 800 hours | B | A | A | C |
|  | 1,000 hours | B | A | A | C |
| Foaming residue | Visual inspection (Bubbles present: X, No bubbles: ○) | ○ | ○ | ○ | ○ |
| Occurrence of shorting defects |  | 0/5 | 0/5 | 0/5 | 0/5 |

As shown in Table 3, at Y–X=1.3 mol/g, when the amount of organopolysiloxane used was 0.0014 g (1 μm), Y–X=0.002 mol (Example 8); when the amount used was 0.0029 g (2 μm), Y–X=0.004 mol (Example 9); when the amount used was 0.01 g (10 in), Y–X=0.02 mol (Example 10). In the organic EL panel EL durability tests in a 60° C., 90% RH environment, at the Y–X amount of 0.002 mol shown in Example 8, results indicative of a good durability were obtained. A good durability was confirmed in each of Examples 9 and 10 in which large amounts of organopolysiloxane were used. On the other hand, at the Y–X amount of 0.001 mol (i.e., Y–X=1.3 mol/g) shown in Comparative Example 3, the amount of organopolysiloxane used was 0.0007 g (0.5 μm) and so the durability was inadequate. With regard to foaming residues and the occurrence of shorting defects, the results were good under all of the conditions shown in Table 3. That is, the results in Table 3 demonstrate that suitable results are obtained at Y–X=0.002 mol or more.

Comparative Example 4

The component (A) ingredients shown in Preparation Example 2 were adjusted to (A-1):(A-2)=50:50 (wt %). In addition, components (B) and (C) were the same as in Preparation Example 2, and Y–X was set to 0.6 mol/g as in Preparation Example 2. The organopolysiloxane composition thus obtained was disposed within the organic EL panel by the procedure indicated in the above organic EL panel fabrication process. The amount of the composition added by dripping within the organic EL panel was set to 0.0014 g (an amount corresponding to a thickness of 1 μm).

Comparative Example 5

The component (A) ingredients shown in Preparation Example 2 were adjusted to (A-1):(A-2)=1:99 (wt %). In addition, components (B) and (C) were the same as in Preparation Example 2, and Y–X was set to 0.6 mol/g as in Preparation Example 2. The organopolysiloxane composition thus obtained was disposed within the organic EL panel by the procedure indicated in the above organic EL panel fabrication process. The amount of the composition added by dripping within the organic EL panel was set to 0.0014 g (an amount corresponding to a thickness of 1 μm).

Comparative Example 6

Figure 3:
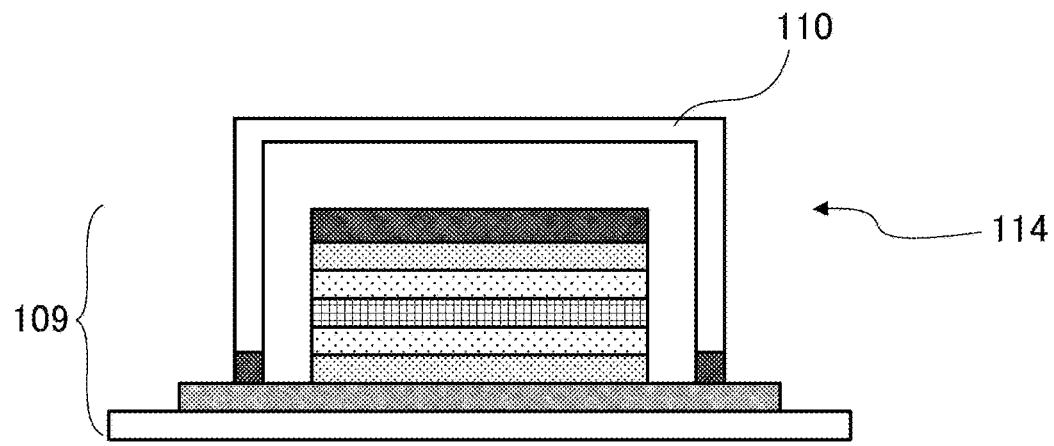
FIG. 3 is a schematic diagram showing an organic EL panel fabricated without the addition of an organopolysiloxane composition within the panel.

For the sake of comparison, an organic EL panel (114) (see FIG. 3) in which no organopolysiloxane composition whatsoever had been added was fabricated as Comparative Example 6, and is shown in Table 4.

The above-described Comparative Example 2 in which the ratio (A-1):(A-2) is 0:100 (wt %) is also included in the table.

TABLE 4

|  |  | Comparative Example | | | |
|---|---|---|---|---|---|
|  |  | 2 | 4 | 5 | 6 |
| Material make-up | (A-1):(A-2) ratio | 0:100 | 50:50 | 1:99 | — |
| Y–X amount per unit weight | Y–X (mol/g) | 0.6 | 0.6 | 0.6 | — |
| Amount used | Film thickness (μm) | 1 | 1 | 1 | — |
|  | Weight (g) | 0.0014 | 0.0014 | 0.0014 | — |
| Y–X amount | Y–X (mol) | 0.0008 | 0.0008 | 0.0008 | — |
| Durability | Initial | A | A | A | A |
| (60° C., | 200 hours | B | B | B | C |
| 90% RH) | 400 hours | B | B | B | C |
|  | 600 hours | C | C | C | C |
|  | 800 hours | C | C | C | C |
|  | 1,000 hours | C | C | C | C |
| Foaming residue | Visual inspection (Bubbles present: X, No bubbles: ○) | ○ | X | X | ○ |
| Occurrence of shorting defects |  | 0/5 | 0/5 | 0/5 | 3/5 |

As shown in Table 4, at Y–X=0.6 mol/g, when the amount of organopolysiloxane used was 0.0014 g (1 μm), Y–X=0.0008 mol (Comparative Examples 2, 4 and 5). With regard to Comparative Examples 4 and 5, as in Comparative Example 2, in a durability test in a 60° C., 90% RH environment, sufficient durability was not obtained. Also, with regard to Comparative Examples 4 and 5, in those cases where the resinous organopolysiloxane serving as component (A-1) was included in an amount of, respectively, 1 part by weight or 50 parts by weight in component (A), when the organopolysiloxane used was cured under heating, bubbles formed within the composition and those bubbles remained upon curing. Given that the residual presence of bubbles is a problem for light transmission, these conditions are unfavorable. In Comparative Example 2 which did not include the resinous organopolysiloxane serving as ingredient (A-1), good results were obtained in terms of residual bubbles. In Comparative Example 6 which included no organopolysiloxane whatsoever, not only was durability not obtained, the occurrence of electrical shorting was confirmed.

The following observations can be made from the above results.

The occurrence of shorting defects is suppressed even under the Y–X=0.0008 mol condition at which the amount of organopolysiloxane composition used is extremely small. The reason is thought to be that the insulation of areas of impurities was promoted by siloxane dispersal.

The occurrence of shorting defects is suppressed even in cases where Y—X is 0.008 mole or more and a resinous organopolysiloxane (A-1) is included in component (A). However, with regard to the EL durability of the organic EL panel under 60° C., 90% RH conditions, it is essential for Y–X to be at least 0.002 mol.

When one part by weight or more of the resinous organopolysiloxane serving as ingredient (A-1) is present in component (A), bubbles end up forming during heat-curing of the organopolysiloxane composition and the residual presence of those bubbles in the composition was found to impair the light transmittivity.

REFERENCE SIGNS LIST

1 Non-alkali glass substrate
102 Anode
103 Hole injection layer
104 Hole transport layer
105 Light-emitting layer
106 Electron transport layer
107 Electron injection layer
108 Cathode
109 Organic EL device layered glass body
110 Non-alkali sealing glass member
111 Organopolysiloxane
112 UV-curable epoxy resin
113 Organic EL panel
114 Organic EL panel (without addition of organopolysiloxane composition)

The invention claimed is:

1. A transparent desiccant for an organic electroluminescent device, the transparent desiccant being a cured organopolysiloxane composition comprising:

(A) an alkenyl group-containing organopolysiloxane which includes a linear organopolysiloxane having at least two alkenyl groups per molecule, (B) an organohydrogenpolysiloxane of formula (I) below:

$$H_a R_b SiO_{(4-a-b)/2} \quad (I)$$

(wherein R is a monovalent hydrocarbon group of 1 to 10 carbon atoms, the subscript "a" is from 0.001 to 1.0 and the subscript "b" is from 0.7 to 2.1), and (C) a hydrosilylation catalyst, wherein the number of moles of silicon-bonded hydrogen atoms Y in component (B) and the number of moles of silicon-bonded alkenyl groups X in component (A) satisfy formula (2) below:

$$0.002 \text{ mole} \leq (Y-X) \leq 0.8 \text{ mole} \quad (2).$$

2. A method of using a transparent desiccant for an organic electroluminescent device, comprising the step of disposing and using the transparent desiccant for the organic electroluminescent device of claim 1 in an organic electroluminescent panel.

3. The method of using the transparent desiccant for the organic electroluminescent device of claim 2, wherein the transparent desiccant is in the form of a sheet having a thickness of from 1.0 μm to 2 mm.

4. The method of using the transparent desiccant for the organic electroluminescent device of claim 2, wherein the transparent desiccant is placed solely above an organic electroluminescent element.

5. The method of using the transparent desiccant for the organic electroluminescent device of claim 3, wherein the transparent desiccant is placed solely above an organic electroluminescent element.

* * * * *